United States Patent
Kagawa

(10) Patent No.: US 9,748,478 B2
(45) Date of Patent: Aug. 29, 2017

(54) MEMORY DEVICE AND METHOD OF MANUFACTURING THE SAME

(71) Applicant: Sony Corporation, Tokyo (JP)

(72) Inventor: Yoshihisa Kagawa, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 0 days.

(21) Appl. No.: 15/145,959

(22) Filed: May 4, 2016

(65) Prior Publication Data
US 2016/0248004 A1 Aug. 25, 2016

Related U.S. Application Data

(62) Division of application No. 13/048,500, filed on Mar. 15, 2011, now Pat. No. 9,373,785.

(30) Foreign Application Priority Data

Mar. 30, 2010 (JP) ................... 2010-079695

(51) Int. Cl.
*H01L 27/112* (2006.01)
*H01L 45/00* (2006.01)
*H01L 27/24* (2006.01)

(52) U.S. Cl.
CPC .......... *H01L 45/085* (2013.01); *H01L 27/112* (2013.01); *H01L 27/24* (2013.01);
(Continued)

(58) Field of Classification Search
CPC ... H01L 45/085; H01L 45/12; H01L 45/1233; H01L 45/124; H01L 45/1266;
(Continued)

(56) References Cited

U.S. PATENT DOCUMENTS 6,133,655 A * 10/2000 Suzuki ............... G11B 19/2009
310/156.06
6,753,247 B1 6/2004 Okoranyanwu et al.
(Continued)

FOREIGN PATENT DOCUMENTS

JP 2006-173267 6/2006
KR 10-0810617 B1 3/2008

OTHER PUBLICATIONS

K. Aratani, et al., "A Novel Resistance Memory with High Scalability and Nanosecond Switching", IEDM, 2007.
(Continued)

*Primary Examiner* — Galina Yushina
(74) *Attorney, Agent, or Firm* — Dentons US LLP

(57) ABSTRACT

A memory device includes: a memory layer that is isolated for each memory cell and stores information by a variation of a resistance value; an ion source layer that is formed to be isolated for each memory cell and to be laminated on the memory layer, and contains at least one kind of element selected from Cu, Ag, Zn, Al and Zr and at least one kind of element selected from Te, S and Se; an insulation layer that isolates the memory layer and the ion source layer for each memory cell; and a diffusion preventing barrier that is provided at a periphery of the memory layer and the ion source layer of each memory cell to prevent the diffusion of the element.

1 Claim, 14 Drawing Sheets

(52) U.S. Cl.
CPC ............ *H01L 45/12* (2013.01); *H01L 45/124* (2013.01); *H01L 45/1233* (2013.01); *H01L 45/1246* (2013.01); *H01L 45/1266* (2013.01); *H01L 45/146* (2013.01); *H01L 45/1625* (2013.01); *H01L 45/1675* (2013.01)

(58) Field of Classification Search
CPC ............ H01L 45/1625; H01L 45/1675; H01L 45/1246; H01L 27/24; H01L 27/112
See application file for complete search history.

(56) References Cited

U.S. PATENT DOCUMENTS

| | | |
|---|---|---|
| 6,770,905 B1 | 8/2004 | Buynoski et al. |
| 7,129,133 B1 | 10/2006 | Avanzino |
| 7,288,782 B1 | 10/2007 | Avanzino et al. |
| 7,307,270 B2 | 12/2007 | Aratani et al. |
| 8,426,839 B1* | 4/2013 | Ma .................... H01L 45/085 257/3 |
| 9,401,472 B1* | 7/2016 | Gopalan ............... H01L 45/00 |
| 2002/0123170 A1 | 9/2002 | Moore et al. |
| 2003/0193059 A1 | 10/2003 | Gilton |
| 2004/0041269 A1 | 3/2004 | Ohnishi |
| 2005/0184397 A1 | 8/2005 | Gates et al. |
| 2006/0126423 A1 | 6/2006 | Aratani et al. |
| 2007/0139987 A1 | 6/2007 | Kouchiyama et al. |
| 2007/0164266 A1 | 7/2007 | Choi |
| 2008/0191188 A1* | 8/2008 | Jeong .................... G11C 11/56 257/4 |
| 2009/0142923 A1 | 6/2009 | Liu et al. |
| 2011/0180775 A1* | 7/2011 | Lin .................... H01L 45/085 257/4 |

OTHER PUBLICATIONS

Chinese Office Examination Report issued in connection with related Chinese Patent Application No. CN 201110075771.3 dated Oct. 21, 2014 with English translation.

Chinese Office Examination Report issued in connection with related Chinese Patent Application No. CN 201110075771.3 dated Mar. 31, 2014.

* cited by examiner

MEMORY DEVICE AND METHOD OF MANUFACTURING THE SAME

RELATED APPLICATION DATA

This application is a division of U.S. patent application Ser. No. 13/048,500 filed Mar. 15, 2011, the entirety of which is incorporated herein by reference to the extent permitted bylaw. The present application claims the benefit of priority to Japanese Patent Application No. JP 2010-079695 filed on Mar. 30, 2010 in the Japan Patent Office, the entirety of which is incorporated by reference herein to the extent permitted by law.

BACKGROUND OF THE INVENTION

1. Field of the Invention

The present invention relates to a memory device as a resistance-variable nonvolatile memory device, and a method of manufacturing the same.

2. Description of the Related Art

A resistance-variable nonvolatile memory device has been suggested in the related art.

As a kind of the resistance-variable nonvolatile memory device, there is disclosed a memory device including a configuration in which a memory layer that stores information by a variation of a resistance value, and an ion source layer that contains an element capable of moving as an ion are laminated (see Aratani et al., "A Novel Resistance Memory with High Scalability and Nanosecond Switching", IEDM2007).

For example, as shown in FIG. 18 showing a cross-sectional view of the memory device, the memory device is configured by interposing a memory layer 53 and an ion source layer 54 between a lower electrode 52 that is a first electrode and an upper electrode that is a second electrode.

In addition, in FIG. 18, a reference numeral 51 indicates an underlayer of the lower electrode 52, and a reference numeral 56 indicates an insulation layer.

The ion source layer 54 contains at least one element selected from Cu, Ag, and Zn and at least one element selected from Te, S, and Se.

The memory layer 53 is made from any one of tantalum oxide, niobium oxide, aluminum oxide, hafnium oxide and zirconium oxide, or a mixed material thereof (for example, see JP-A-2006-173267).

SUMMARY OF THE INVENTION

The structure shown in FIG. 18 is a structure for describing a principle of an operation of the memory device.

In an actual device, especially when the miniaturization of the device size is progressed, an ion source layer 53 and a memory layer 54 are necessary to be isolated for each memory cell, as shown in FIG. 19.

In addition, in FIG. 19, a reference numeral 51 indicates an underlayer of a lower electrode 52, and reference numeral 56 indicates a layer (insulation layer or the like) covering an upper electrode 55. In addition, a reference numeral 57 indicates an insulation layer that isolates each memory cell. In addition, in FIG. 19, the ion source layer 53 and the memory layer 54 are shown vertically reverse to the configuration of FIG. 18.

At this time, an element such as Cu, which is contained in the ion source layer 53 or the memory layer 54, has a large expansion coefficient in metals and insulation films, and diffuses between memory cells or between interconnections during an operation of the device. This may be a cause of inhibiting the operation as a stable memory device.

In addition, this problem may be more considerable as miniaturization in the size of the memory device takes place in the future.

The invention addresses the above-identified and other problems associated with conventional method and apparatus and it is desirable to provide a memory device and a manufacturing method of the same that can stably operate even when the device is made to be miniaturized.

According to an embodiment of the invention, there is provided a memory device including a memory layer that is isolated for each memory cell and stores information by a variation of a resistance value. In addition, the memory device includes an ion source layer that is formed to be isolated for each memory cell and to be laminated on the memory layer, and contains at least one kind of element selected from Cu, Ag, Zn, Al and Zr and at least one kind of element selected from Te, S and Se. In addition, the memory device includes an insulation layer that isolates the memory layer and the ion source layer for each memory cell, and a diffusion preventing barrier that is provided at a periphery of the memory layer and the ion source layer of each memory cell to prevent the diffusion of the element.

According to the memory device of this embodiment of the invention, the diffusion preventing barrier is provided at a periphery of the memory layer and the ion source layer of each memory cell.

Therefore, it is possible to suppress or prevent the diffusion of an element such as Cu contained in the laminated structure of the memory layer and the ion source layer, which has a high diffusion coefficient by the diffusion preventing barrier.

According to another embodiment of the invention, there is provided a method of manufacturing a memory device. The method includes a step of forming an insulation layer on the lower electrode and opening a hole reaching the lower electrode in the insulation layer.

In addition, the method includes a step of forming, on a surface, a nitride film or oxide film of a metal element selected from Ti, Ta, Ru, Mn, Al, Co and W or an alloy of these metal elements, which is thinner than a depth of the hole and a step of removing the nitride film or oxide film in a lower portion of the hole to expose the lower electrode.

In addition, the method includes a step of forming a first film that comes into contact with the lower electrode, is thinner than the depth of the hole and serves as the memory layer.

In addition, the method includes a step of forming, on the first film, a second film that is buried in the hole and serves as an ion source layer containing at least one kind of element selected from Cu, Ag, Zn, Al and Zr, and at least one kind of element selected from Te, S and Se.

In addition, the method includes a step of planarizing a surface to remove a portion of each of the nitride film or oxide film, the first film and the second film, which is located on the insulation layer, with a portion in the hole being made to remain, and to forma diffusion preventing barrier film that is made from the nitride film or oxide film and prevents the diffusion of the element, a memory layer made from the first film, and an ion source layer made of the second film.

In addition, the method includes a step of forming an upper electrode on the ion source layer.

According to the method of manufacturing a memory device of this embodiment of the invention, the memory layer and the ion source layer are formed at an inner side of the hole that is opened in the insulation layer. Therefore, the memory layer and the ion source layer are formed to be isolated for each memory cell by the insulation layer.

In addition, the nitride film or oxide film that is thinner than the depth of the hole is formed, the nitride film or oxide film in a lower portion of the hole is removed, and a portion located on the insulation layer is removed with a portion in the hole being made to remain, such that the diffusion preventing barrier film made from the nitride film or oxide film is formed. Therefore, it is possible to form a diffusion prevention barrier film on a side wall of the hole.

In addition, the first film serving the memory layer and the second film serving as the ion source layer are formed on the oxide film or nitride film, and a portion of each of the first film and the second film, which is located on the insulation layer, is removed to form the memory layer and the ion source layer with a portion in the hole being made to remain. Therefore, the memory layer and the ion source layer are formed at an inner side of the diffusion preventing barrier film. That is, it is possible to manufacture a memory device of which the diffusion preventing barrier film is formed at a periphery of the memory layer and the ion source layer.

According to still another embodiment of the invention, there is provided a method of manufacturing a memory device. The method includes a step of forming an insulation layer made from an oxide on a lower electrode and opening a hole reaching the lower electrode in the insulation layer.

In addition, the method includes a step of forming a film that comes into contact with the lower electrode, is thinner than a depth of the hole, and serves as a memory layer containing Mn or Al.

In addition, the method includes a step of forming, on the memory layer, a second film that is buried in the hole and serves as an ion source layer containing at least one kind of element selected from Cu, Ag, Zn, Al and Zr, and at least one kind of element selected from Te, S and Se.

In addition, the method includes a step of diffusing Mn or Al contained in the film serving as the memory layer, through a heat treatment, to form a diffusion preventing barrier film, which is made from an oxide film and prevents the diffusion of the element, at an interface with the insulation layer.

In addition, the method includes a step of planarizing a surface to remove a portion of each of the diffusion preventing barrier film, the film serving as the memory layer, and the second film, which is located on the insulation layer, with a portion in the hole being made to remain, and to form a memory layer made from the film serving as the memory layer and an ion source layer made from the second film.

In addition, the method includes a step of forming an upper electrode on the ion source layer.

According to the method of manufacturing a memory device of this embodiment of the invention, the memory layer and the ion source layer are formed at an inner side of the hole that is opened in the insulation layer. Therefore, the memory layer and the ion source layer are formed to be separated for each memory cell by the insulation layer.

In addition, the film that is thinner than the depth of the hole and serves as the memory layer containing Mn or Al is formed, and the second film that is buried in the hole and serves as the ion source layer is formed. Then, Mn or Al contained in the film serving as the memory layer diffuses through the heat treatment to form the oxide film at the interface with the insulation layer. In addition, a portion of the oxide film, which is located on the insulation layer, is removed with a portion in the hole being made to remain, to form the diffusion preventing barrier film made from the oxide film. Therefore, it is possible to form the diffusion preventing barrier film on the side wall of the hole.

In addition, a portion of each of the film serving as the memory layer and the second film, which is located on the insulation layer, is removed with a portion in the hole being made to remain, to form the memory layer and the ion source layer. Therefore, the memory layer and the ion source layer are formed at an inner side of the diffusion preventing barrier film. That is, it is possible to manufacture a memory device of which a diffusion preventing barrier film is formed at the periphery of the memory layer and the ion source layer.

According to yet another embodiment of the invention, there is provided a method of manufacturing a memory device. The method includes a step of forming a diffusion preventing barrier layer, which is made from an insulation layer and prevents the diffusion of an element, on a lower electrode, and opening a hole reaching the lower electrode in the diffusion preventing barrier layer.

In addition, the method includes a step of forming a first film that comes into contact with the lower electrode, is thinner than a depth of the hole and serves as a memory layer.

In addition, the method includes a step of forming, on the first film, a second film that is buried in the hole and serves as an ion source layer containing at least one kind of element selected from Cu, Ag, Zn, Al and Zr, and at least one kind of element selected from Te, S and Se.

In addition, the method includes a step of planarizing a surface to remove a portion of each of the first film and the second film, which is located on the diffusion prevention barrier layer, with a portion in the hole being made to remain, and to form a memory layer made from the first film and an ion source layer made from the second film.

In addition, the method includes a step of forming an upper electrode on the ion source layer.

According to the method of manufacturing a memory device of this embodiment of the invention, the first film serving as the memory layer and the second film serving as the ion source layer are formed, and a portion of each of the first and second films, which is located on the diffusion preventing barrier layer, is removed with a portion in the hole being made to remain, to form the memory layer and the ion source layer. Therefore, the memory layer and the ion source layer are formed at an inner side of the diffusion preventing barrier layer. That is, it is possible to manufacture a memory device of which the diffusion preventing barrier film is formed at a periphery of the memory layer and the ion source layer.

In addition, the memory layer and the ion source layer are formed at an inner side of the hole that is opened in the diffusion preventing barrier layer made of the insulation layer. Therefore, the memory layer and the ion source layer are formed to be separated for each memory cell by the diffusion preventing barrier layer.

According to still yet another embodiment of the invention, there is provided a method of manufacturing a memory device. The method includes a step of forming sequentially, on a lower electrode, each layer of a memory layer, an ion source layer containing at least one kind of element selected from Cu, Ag, Zn, Al and Zr, and at least one kind of element selected from Te, S and Se, and an upper electrode.

In addition, the method includes a step of patterning the memory layer, the ion source layer and the upper electrode with a pattern for each memory cell and a step of forming a diffusion preventing barrier layer that is made from an insulation layer and that prevents the diffusion of the element, by entirely covering the memory layer, the ion source layer, and the upper electrode.

In addition, the method includes a step of forming an opening reaching the upper electrode in the diffusion preventing barrier layer.

According to the method of manufacturing a memory device of this embodiment of the invention, the memory layer, the ion source layer, and the upper electrode are patterned with a pattern for each memory cell and the diffusion preventing barrier layer made from the insulation layer is formed by entirely covering the memory layer, the ion source layer, and the upper electrode.

Therefore, it is possible to manufacture a memory device of which the diffusion preventing barrier layer is formed at a periphery of the memory layer and the ion source layer.

In addition, because the memory layer and the ion source layer are covered with the diffusion preventing barrier layer after being patterned with a pattern for each memory cell, the diffusion preventing barrier layer is formed between adjacent memory cells. Therefore, the memory layer and the ion source layer are formed to be separated for each memory cell by the diffusion preventing barrier layer.

According to the above-described embodiments of the invention, it is possible to suppress or prevent the diffusion of an element such as Cu contained in the structure configured by laminating the memory layer and the ion source layer, which has a high diffusion coefficient. Therefore, it is possible to suppress or prevent the element from diffusing into an adjacent memory cell or between the memory cells.

Therefore, according to the embodiments of the invention, it is possible to suppress the variation in characteristics of the memory device such as a write-in voltage, a read-out voltage, and the resistance to repetition for each memory cell.

In addition, since it is possible to suppress the deterioration of the characteristics caused by the diffusion of the element into the outside of the memory cell, the characteristic of the resistance to repetition can be improved.

In addition, since it is possible to decrease the margin of a write-in voltage and a read-out voltage for reliably performing the write-in operation and read-out operation by suppressing the variation of the characteristics for each memory cell, it is possible to allow a write-in voltage and a read-out voltage to be lowered.

In addition, the variation of characteristics for each memory cell is suppressed, such that it is possible to reliably perform the write-in and the read-out operation and thereby it is possible to stably operate the memory device.

Therefore, even when the device is made to be miniaturized, it is possible to realize a memory device that can stably operate.

DESCRIPTION OF THE PREFERRED EMBODIMENTS

Figure 1:
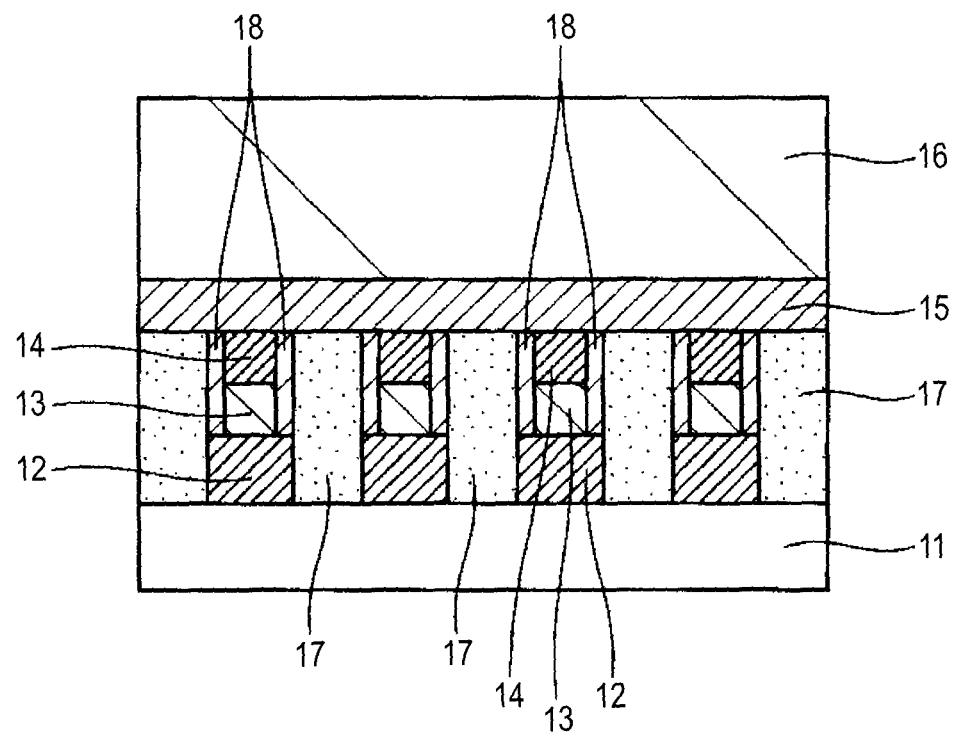
FIG. 1 is a schematic configuration view (cross-sectional view) of a first type memory device according to an embodiment of the invention.

Hereinafter, preferred modes for carrying out the invention (hereinafter, referred to as "embodiments") will be described.

Description will be made in the following order.
1. Outline of the invention
2. A first embodiment
3. A second embodiment
4. A third embodiment
5. A fourth embodiment

1. Outline of the Invention

First, an outline of the invention will be described prior to the description of specific embodiments of the invention.

In the embodiment of the invention, a memory device, which is a kind of a resistance-variable nonvolatile memory device described above, adopts a configuration in which a memory layer storing information according to a variation of a resistance and an ion source layer containing an element that can move as an ion are laminated.

In the embodiment of the invention, the memory layer and the ion source layer are isolated for each memory cell for allowing the miniaturization of the memory device.

As a material of the memory layer of which a resistance value is varied, an oxide of a metal element such as Ta, Nb, Al, Hf, Zr, Ni, Co and Ce may be used.

The ion source layer containing elements that can move as ions is configured to contain at least one kind of element selected from Cu, Ag, Zn, Al and Zr and at least one kind of element selected from Te, S and Se.

The memory layer and the ion source layer are configured using the above-described material, such that at least one kind of element selected from Cu, Ag, Zn, Al and Zr contained in the ion source layer can move as an ion.

The memory device according to the embodiment of the invention is configured as described above, such that it operates as described below and can store information.

First, at a state where a resistance value of the memory layer is high, when a voltage is applied to the memory layer and the ion source layer so that the ion source layer side of the memory device becomes a positive electric potential, an element that is contained in the ion source layer and can move as an ion is ionized and diffuses into the inside of the memory layer. The diffused ion remains inside the memory layer or is bonded with an electron at a portion of an electrode connected to the memory layer side to be precipitated, such that a conduction path is formed at an inner side of the memory layer and thereby a resistance value of the memory layer becomes lowered.

In addition, at a state where the resistance value of the memory layer becomes lowered, when a voltage is applied so that the ion source layer side becomes a negative electric potential, the element that diffused in the memory layer is again ionized to return into the ion source layer and thereby a resistance value of the memory layer becomes high.

As described above, since the resistance value of the memory layer varies and a state of the varied resistance value is maintained, it is possible to store information according to a resistance value of the memory layer.

Each layer besides the memory layer has a resistance value sufficiently lower than that of the memory layer. Therefore, the resistance value of a memory cell varies in connection with the resistance value of the memory layer, such that it is possible to readout information stored in the memory cell by detecting the resistance value of the memory cell.

In addition, in the embodiment of the invention, a diffusion preventing barrier is provided at a periphery of the memory layer and the ion source layer of the memory cell so as to prevent the diffusion of the Cu or the like described above.

Specifically, two types of memory device are configured as described below.

In a first type of memory device according to an embodiment of the invention, a relatively thin diffusion preventing barrier is formed between side walls of the memory layer and the ion source layer of each memory cell and an insulation layer isolating each memory cell.

As a material of this type of diffusion preventing barrier, an oxide or nitride of a metal such as Ti, Ta, Ru, Mn, Al, Co and W and an alloy of these metals, amorphous SiN, amorphous SiCN, or the like may be used.

FIG. 1 shows a schematic configuration view (cross-sectional view) of a first type memory device according to an embodiment of the invention.

Figure 19:
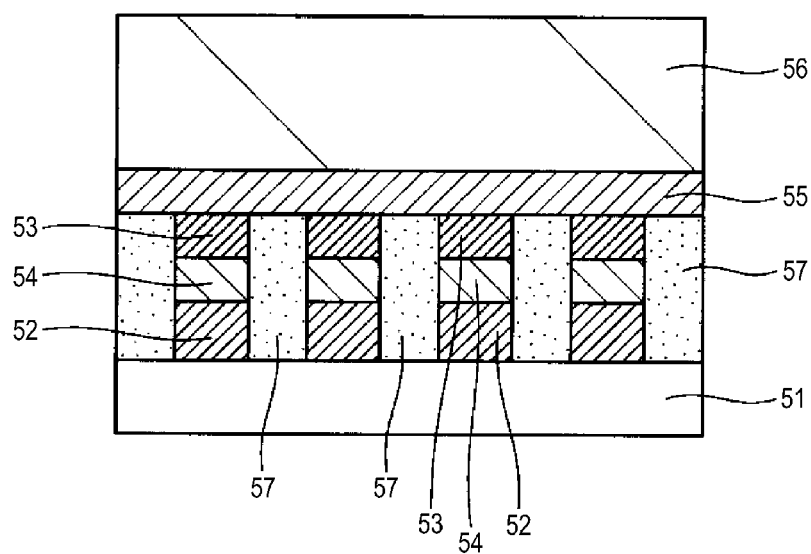
FIG. 19 is a cross-sectional view illustrating a configuration where the memory device of FIG. 18 is isolated for each memory cell.

A memory device shown in FIG. 1 has a configuration corresponding to that of the memory device shown in FIG. 19.

A lower electrode 12, a memory layer 13, and an ion source layer 14, which are isolated for each memory cell by an interlayer insulation layer 17, are formed on an underlayer 11. A common upper electrode 15 is formed on the ion source layer 14.

A diffusion preventing barrier film. 18 is formed between side walls of the memory layer 13 and the ion source layer 14 of each memory cell and the interlayer insulation layer 17 isolating each memory cell.

In addition, a reference numeral 16 of FIG. 1 indicates a layer (insulation layer or the like) that covers the upper electrode 15. In addition, as the underlayer 11, a conduction layer such as a semiconductor substrate, a wiring and a plug layer, and an insulation layer insulating and isolating the conduction layer are included.

In the first type of memory device according to the embodiment of the invention, as shown in FIG. 1, the diffusion preventing barrier film 18 is formed between a side wall of the memory layer 13 and the ion source layer 14 of each memory cell and the interlayer insulation layer 17 isolating each memory cell. Therefore, it is possible to suppress or prevent the diffusion of an element such as Cu contained in the memory layer 13 or the ion source layer 14, which has a high diffusion coefficient by the diffusion preventing barrier film 18. That is, it is possible to suppress or prevent the element from diffusing into an adjacent memory cell or the interlayer insulation layer 17 between the memory cells.

Therefore, it is possible to suppress the variation in characteristics of the memory device such as a write-in voltage, a read-out voltage, and the resistance to repetition for each memory cell.

In addition, since it is possible to suppress the deterioration of the characteristics caused by the diffusion of the element into the outside of the memory cell, the characteristic of the resistance to repetition can be improved.

In addition, since it is possible to decrease the margin of a write-in voltage and a read-out voltage for reliably performing the write-in operation and read-out operation by suppressing the variation of the characteristics for each memory cell, it is possible to allow a write-in voltage and a read-out voltage to be lowered.

In addition, the variation of characteristics for each memory cell is suppressed, such that it is possible to reliably perform the write-in and the read-out operation and thereby it is possible to stably operate the memory device.

Therefore, even when the device is made to be miniaturized, it is possible to realize a memory device that can stably operate.

A second type of memory device uses an insulation layer isolating each memory cell as the diffusion preventing barrier.

As a material of the diffusion preventing barrier, a nitrogen-containing resin material, amorphous SiN, amorphous SiCN, or the like may be used.

Figure 2:
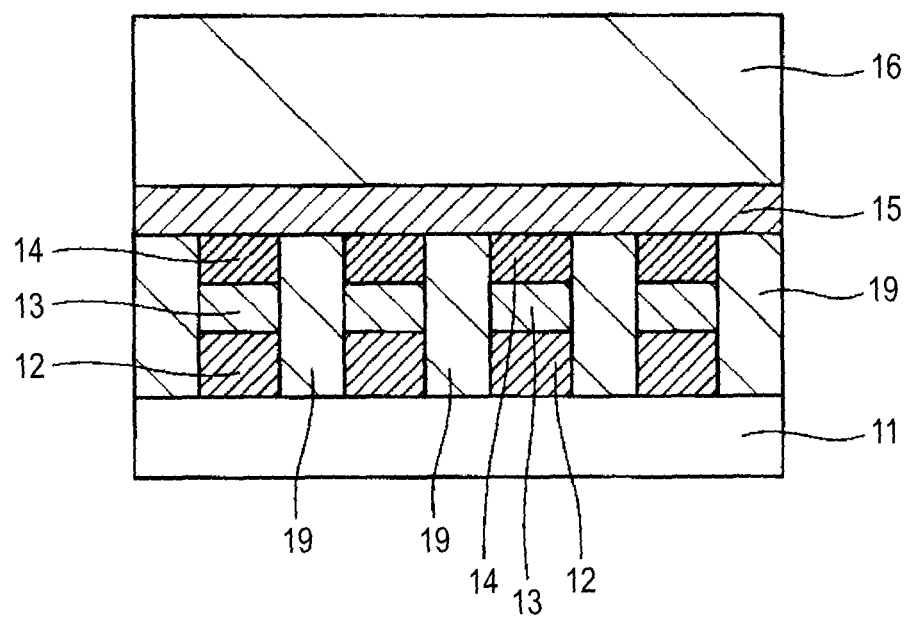
FIG. 2 is a schematic configuration view (cross-sectional view) of a second type memory device according to an embodiment of the invention.

FIG. 2 shows a schematic configuration view (cross-sectional view) of the second type of memory device according to an embodiment of the invention.

The memory device shown in FIG. 2 has a configuration corresponding to that of the memory device shown in FIG. 19.

A lower electrode 12, a memory layer 13 and an ion source layer 14, which are isolated for each memory cell by an insulation layer, are formed on an underlayer 11. A common upper electrode 15 is formed on the ion source layer 14. A reference numeral 16 of FIG. 2 indicates a layer (insulation layer or the like) that covers the upper electrode 15.

As the insulation layer isolating each memory cell, a diffusion preventing barrier layer 19 is formed.

In the second type of memory device according to the embodiment of the invention, as shown in FIG. 2, the diffusion preventing barrier layer 19 is formed as an insulation layer isolating each memory cell, such that it is possible to suppress or prevent the diffusion of an element such as Cu contained in the memory layer 13 or the ion source layer 14, which has a high diffusion coefficient.

Therefore, it is possible to suppress the variation in characteristics of the memory device such as a write-in voltage, a read-out voltage, and the resistance to repetition for each memory cell.

In addition, since it is possible to suppress the deterioration of the characteristics caused by the diffusion of the element into the outside of the memory cell, the characteristic of the resistance to repetition can be improved.

In addition, since it is possible to decrease the margin of a write-in voltage and a read-out voltage for reliably performing the write-in operation and read-out operation by suppressing the variation of the characteristics for each memory cell, it is possible to allow a write-in voltage and a read-out voltage to be lowered.

In addition, the variation of characteristics for each memory cell is suppressed, such that it is possible to reliably perform the write-in and the read-out operation and thereby it is possible to stably operate the memory device.

Therefore, even when the device is made to be miniaturized, it is possible to realize a memory device that can stably operate.

2. A First Embodiment

Next, specific embodiments of a memory device of the invention will be described.

Figure 3:
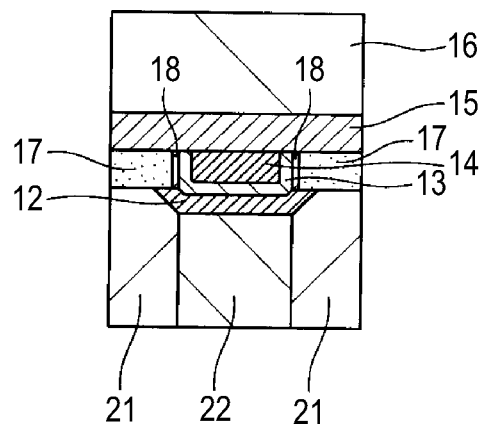
FIG. 3 is a schematic configuration view (cross-sectional view) of a memory device according to a first embodiment of the invention.

FIG. 3 shows a schematic configuration view (cross-sectional view) of a memory device according to a first embodiment of the invention.

This embodiment is a specific embodiment of the first type of memory device shown in FIG. 1.

In addition, FIG. 3 shows a cross-sectional view of one memory cell, but the memory device is actually configured by a plurality of memory cells.

In the memory device of the first embodiment, as shown in FIG. 3, a lower electrode 12, a memory layer 13, and an ion source layer 14 of a memory cell are formed in this order on a polysilicon plug layer 22 that is formed to be buried in an insulation layer 21 such as a silicon oxide layer. An upper electrode 15 is formed on these components in common with an adjacent memory cell. In FIG. 3, a reference number 16 indicates a layer (insulation layer or the like) that covers the upper electrode 15. An insulation layer 21 and a polysilicon plug layer 22 correspond to the underlayer 11 formed under the lower electrode 12 in FIG. 1. The polysilicon plug layer 22 connects to a transistor or the like (not shown) that are formed under thereof to select the memory cell.

An adjacent memory cell is isolated by an interlayer insulation layer 17.

The lower electrode 12 is formed in a manner that a portion of an upper surface thereof is formed in a concave shape. This concave portion is formed at the time of etching in a manufacturing method to be described below. In addition, the upper surface of the lower electrode 12 is formed to have a pattern wider than the memory layer 13. As described above, the upper surface is formed to have a pattern wider than the memory layer 13, such that even when alignment deviation between the lower electrode 12 and the memory layer 13 may occur, the entirety of the lower surface of the memory layer 13 can be allowed to come into contact with the lower electrode 12.

The memory layer 13 is formed to bury the concave portion in the upper surface of the lower electrode 12 and to have a U-shaped cross section.

The ion layer 14 is formed on the memory layer 13 and inside the memory layer 13 having the U-shaped cross section.

As a material of the lower electrode 12 and the upper electrode 15, W, WN, Ti, TiN, or the like may be used. In addition, other electrode material used as a semiconductor material may be used.

As a material of the memory layer 13, an oxide of a metal element such as Ta, Nb, Al, Hf, Zr, Ni, Co, and Ce may be used.

As a material of the ion source layer 14, a material including at least one kind of element selected from Cu, Ag, Zn, Al, and Zr and at least one kind of element selected from Te, S, and Se may be used. For example, CuTe, AlTe, or the like may be used.

In this embodiment, especially, a diffusion preventing barrier film 18 is formed between a side wall of the memory layer 13 and an interlayer insulation layer 17 isolating each memory cell.

As a material of the diffusion preventing barrier film 18, an oxide or nitride of a metal such as Ti, Ta, Ru, Mn, Al, Co, and W and an alloy of these metals, amorphous SiN, amorphous SiCN, or the like may be used.

Therefore, it is possible to suppress or prevent the diffusion of an element such as Cu contained in the memory layer 13 or the ion source layer 14, which has a high diffusion coefficient.

The memory device of this embodiment can be manufactured, for example, as described below.

Figure 4A:
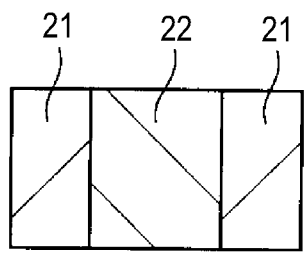
FIGS. 4A to 4C are manufacturing process views illustrating a method of manufacturing the memory device of FIG. 3.

First, as shown in FIG. 4A, in the insulation layer 21 such as a silicon oxide layer, the polysilicon plug layer 22 connected to a transistor (not shown) is formed to be buried therein.

Figure 4B:
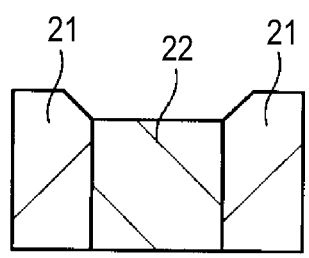

Then, as shown in FIG. 4B, the upper portion of the polysilicon plug layer 22 is made to be recessed further than the neighboring insulation layer 21 through dry etching. CxFy (x=1 to 6, y=1 to 8), $O_2$, or a rare gas is used for the dry etching, and a general magnetron type etching device is used as an etching device.

Next, a metal film made of W, WN, Ti, TiN, or the like is buried in an opening of the polysilicon plug layer 22 by an RF sputtering process.

Figure 4C:
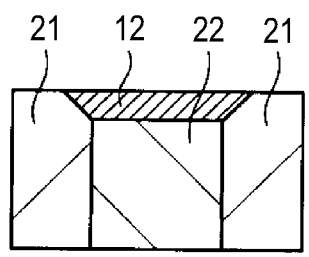

In addition, a metal film remaining on the insulation layer 21 is removed by using a CMP (Chemical Mechanical Polishing) method or dry etching, and then as shown in FIG. 4C, the lower electrode 12 made of a metal film is formed on the polysilicon plug layer 22.

Next, an interlayer insulation layer having a thickness of 20 to 300 nm is formed by entirely covering the insulation layer 21 and the polysilicon plug layer 22. As a material of the interlayer insulation layer, for example, $SiO_2$ or SiN is used. In addition, as a method of forming the interlayer insulation layer, either a plasma CVD (Chemical Vapor Deposition) method or a spin coat method may be used. By doing so, the interlayer insulation layer is formed on the lower electrode 12.

Figure 5D:
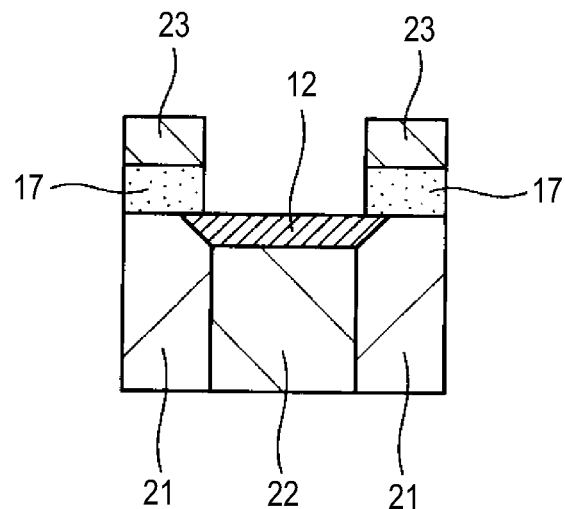
FIGS. 5D to 5F are manufacturing process views illustrating a method of manufacturing the memory device of FIG. 3.

In addition, as shown in FIG. 5D, a resist mask 23 is formed on the interlayer insulation layer 17. A hole reaching the lower electrode 12 is formed to be opened in the interlayer insulation layer 17 by lithography and a dry etching using the resist mask 23.

These processes may use a method used in a method of manufacturing a semiconductor in the related art.

As the lithography, a KrF exposure device, an ArF exposure device, or a liquid immersion ArF exposure device is used for patterning the resist mask 23. In addition, for the dry etching, CxFy (x=1 to 6, y=1 to 8), $O_2$, or a rare gas is used as an etching gas, and a general magnetron type etching device is used as an etching device.

Figure 5E:
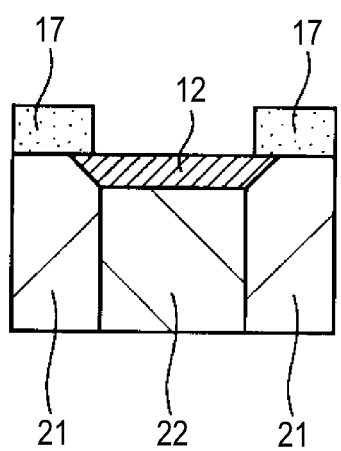

After the interlayer insulation layer 17 is etched, for example, the resist mask 23 and a remaining attached material generated at the time of the etching process are completely removed by an ashing process using oxygen plasma as a base or an organic amine-series chemical process as shown in FIG. 5E.

Figure 5F:
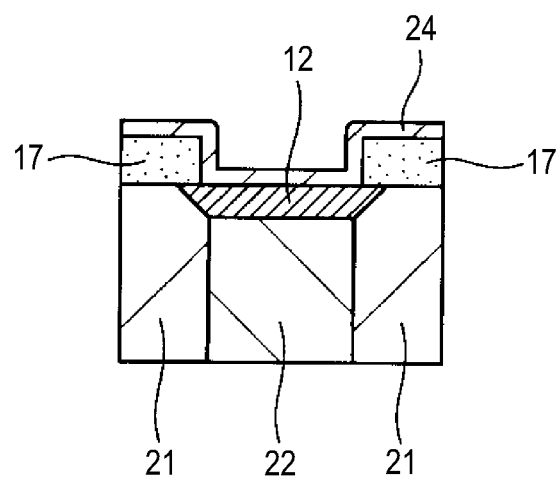

Next, as shown in FIG. 5F, a nitride film or oxide film 24, which is thinner than a depth of the hole and serves as the diffusion preventing barrier film 18, is formed on the surfaces of the interlayer insulation layer 17 and the lower electrode 12 by an RF sputtering process. Specifically, for example, under an $Ar/N_2$ atmosphere or $Ar/O_2$ atmosphere, as the nitride film or oxide film 24, a nitride or oxide of Ti, Ta, Ru, Mn, Al, Co and W is formed in a thickness of 5 to 50 nm.

Figure 6G:
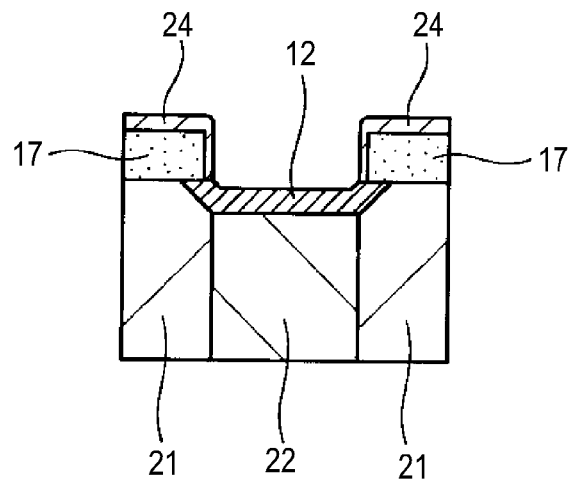
FIGS. 6G to 6I are manufacturing process views illustrating a method of manufacturing the memory device of FIG. 3.

In addition, by an inverse-sputtering method (method of emitting a rare gas ion onto a substrate surface by the application of an RF to the substrate and physically removing impurities on the surface), the nitride film or oxide film 24 (metal nitride or metal oxide) is removed, such that the bottom surface of the hole is made as shown in FIG. 6G. At this time, the lower electrode 12 is exposed, and a portion of the lower electrode 12, which is exposed to the opening of the metal film, is cut-off, such that a concave portion is formed.

Figure 6H:
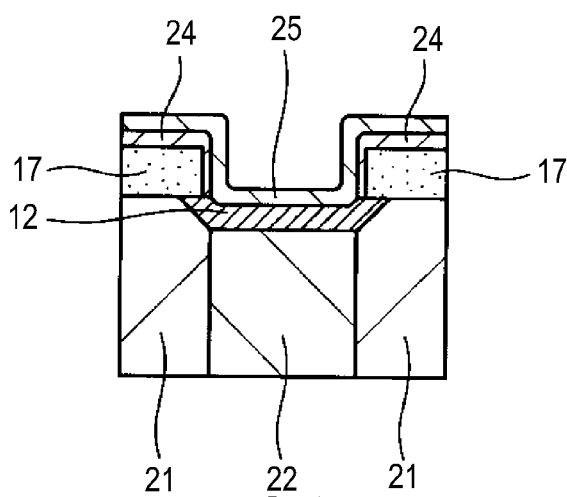

Next, as shown in FIG. 6H, a first film 25, that is, a tantalum oxide film, a niobium oxide film or the like, which comes into contact with the lower electrode 12, is thinner than a depth of the hole and serves as the memory layer 13, is formed in a thickness of 1 to 50 nm, by the same RF sputtering process.

Therefore, the concave portion of the lower electrode 12 is buried by the first film 25 serving as the memory layer 13, and the first film 25 is formed on the lower portion and the side wall of the hole.

Figure 6I:
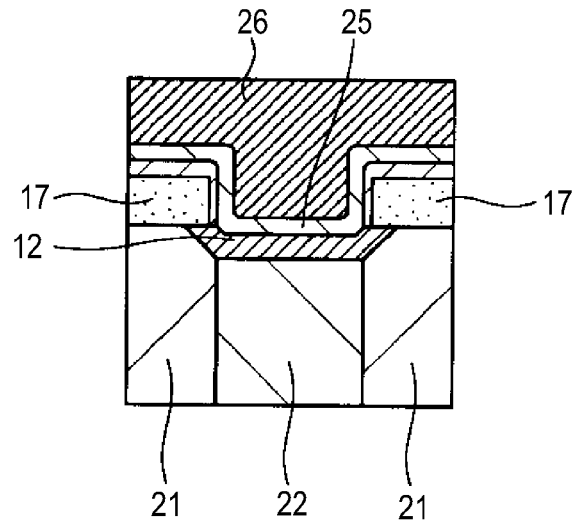

Subsequently, as shown in FIG. 6I, a second film 26, that is, a CuTe film or the like, a portion of which is buried in the hole and serves as the ion source layer 14, is formed on the first film 25 in a thickness of 5 to 300 nm by the RF sputtering process.

Figure 7J:
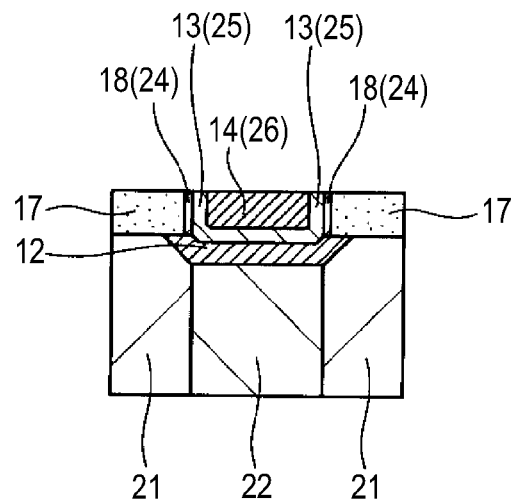
FIGS. 7J and 7K are manufacturing process views illustrating a method of manufacturing the memory device of FIG. 3.

Next, the surface of the second film 26 is planarized by a CMP method, and thereby a portions of the nitride film or oxide film 24, the first film 25 and the second film 26, which are located on the interlayer insulation layer 17, are removed with portions within the hole being made to remain. Therefore, as shown in FIG. 7J, the diffusion preventing barrier film 18 made from a remainder portion of the nitride film or oxide film 24, the memory layer 13 made of a remainder portion of the first film 25, and the ion source layer 14 made of a remainder portion of the second film 26 that remain in the hole.

Figure 7K:
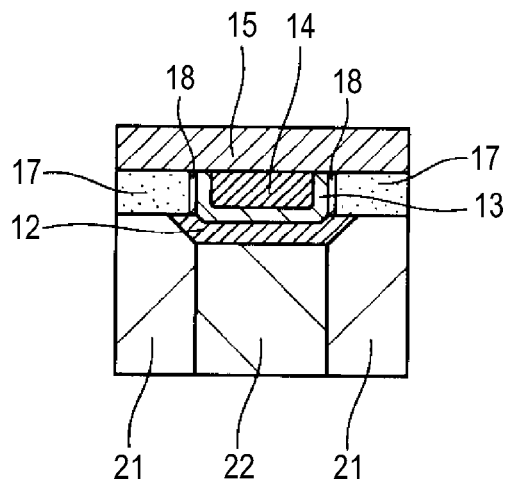

Then, as shown in FIG. 7K, the upper electrode 15 is formed on the surfaces of the ion source layer 14, the memory layer 13, the diffusion preventing barrier film 18, and the interlayer insulation film 17 by an RF sputtering process. Therefore, the upper electrode 15 is formed to connect to the surface of the ion source layer 14.

In addition, the layer 16 (insulation layer or the like) covering the upper electrode 15 is formed, such that it is possible to manufacture the memory device shown in FIG. 3.

In addition, even when amorphous SiN or amorphous SiCN is used instead of the metal nitride or metal oxide as the diffusion preventing barrier film 18, the diffusion preventing barrier film 18 may be formed by the same process as described above.

Specifically, the amorphous SiN or the amorphous SiCN may be formed by a plasma CVD method, and the amorphous SiN or the amorphous SiCN in a lower portion of the hole may be removed by the etching gas and the etching device described above.

According to the configuration of the memory device of the above-described embodiment, the diffusion preventing barrier film 18 is formed between a side wall of the memory layer 13 and the interlayer insulation layer 17 isolating each memory cell. Therefore, it is possible to suppress or prevent the diffusion of an element such as Cu contained in the memory layer 13 or the ion source layer 14, which has a high diffusion coefficient.

Therefore, according to the configuration of the memory device of this embodiment, it is possible to suppress the variation in characteristics of the memory device such as a write-in voltage, a read-out voltage and the resistance to repetition for each memory cell.

In addition, since it is possible to suppress the deterioration of the characteristics caused by the diffusion of the element into the outside of the memory cell, the characteristic of the resistance to repetition can be improved.

In addition, since it is possible to decrease the margin of a write-in voltage and a read-out voltage for reliably performing the write-in operation and read-out operation by suppressing the variation of the characteristics for each memory cell, it is possible to allow a write-in voltage and a read-out voltage to be lowered.

In addition, the variation of characteristics for each memory cell is suppressed, such that it is possible to reliably perform the write-in and the read-out operation and thereby it is possible to stably operate the memory device.

Therefore, even when the device is made to be miniaturized, it is possible to realize a memory device that can stably operate.

3. A Second Embodiment

Figure 8:
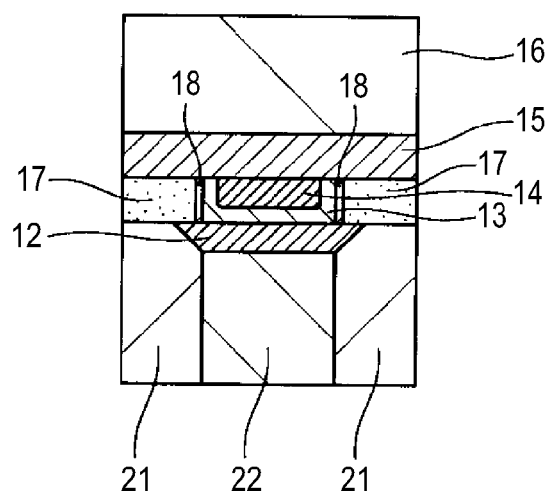
FIG. 8 is a schematic configuration view (cross-sectional view) of a memory device according to a second embodiment of the invention.

FIG. 8 shows a schematic configuration view (cross-sectional view) of a memory device according to a second embodiment of the invention.

This embodiment is a specific embodiment of the first type of memory device shown in FIG. 1 and a configuration thereof is slightly different from that of the first embodiment shown in FIG. 3.

In addition, FIG. 8 also shows a cross-sectional view of one memory cell similar to the FIG. 3 of the first embodiment, but the memory device is actually configured by a number of memory cells.

In the memory device of the second embodiment, as shown in FIG. 8, a concave portion is not formed on the upper surface of the lower electrode 12 and the upper surface of the lower electrode 12 is formed as a flat surface flush with the upper surface of the insulation layer 21. A memory layer 13 is formed on the upper surface of the flat lower electrode 12.

The other configurations are substantially the same as those of the memory device of the first embodiment shown in FIG. 3.

That is, the diffusion preventing barrier film 18 is formed between the side wall of the memory layer 13 and the interlayer insulation layer 17 isolating each memory cell.

Therefore, it is possible to suppress or prevent the diffusion of an element such as Cu contained in the memory layer 13 or the ion source layer 14, which has a high diffusion coefficient.

In addition, in this embodiment, by adopting manufacturing method described below, an oxide is used for the interlayer insulation layer 17, and the diffusion prevention barrier film 18 is formed from an oxide of a metal such as Mn and Al and an alloy of these metals.

As a material of each of the lower electrode 12, the upper electrode 15, the memory layer 13 and the ion source layer 14, the materials described as an example in the first embodiment may be used.

The memory device of this embodiment can be manufactured, for example, as described below.

Each of the processes from a process of opening the interlayer insulation layer 17 to a process of removing the etching mask 23 are substantially the same as those of the first embodiment shown in FIG. 4A to FIG. 5E. Therefore, FIGS. 4A to 5E are adopted and description thereof will be omitted.

Figure 9F:
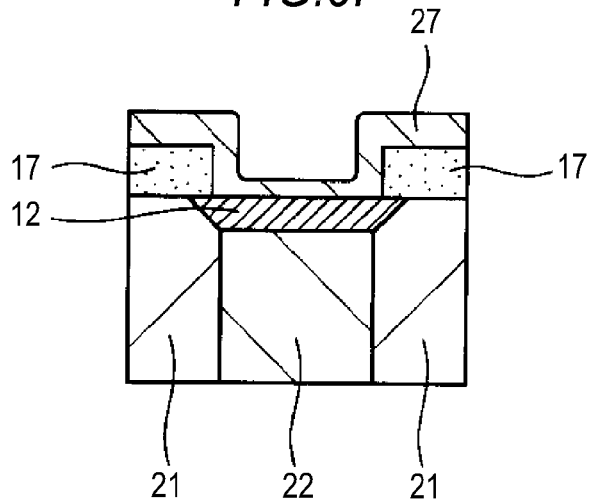
FIGS. 9F to 9H are manufacturing process views illustrating a method of manufacturing the memory device of FIG. 8.

In this embodiment, from the same state as that shown in FIG. 5E, as shown in FIG. 9F, a third film 27, which comes into contact with the lower electrode 12, is thinner than the depth of the hole and serves as the memory layer 13, is formed in a thickness of 1 to 50 nm by an RF sputtering process. Therefore, the third film 27 is formed on the bottom portion and the side wall of the hole.

At this time, an alloy target or a plurality of targets are used, such that 1 to 20 atomic % of Mn or Al is mixed in the third film 27 such as a tantalum oxide film and a niobium oxide film. This configuration is different from that of the first film 25 of the first embodiment.

Figure 9G:
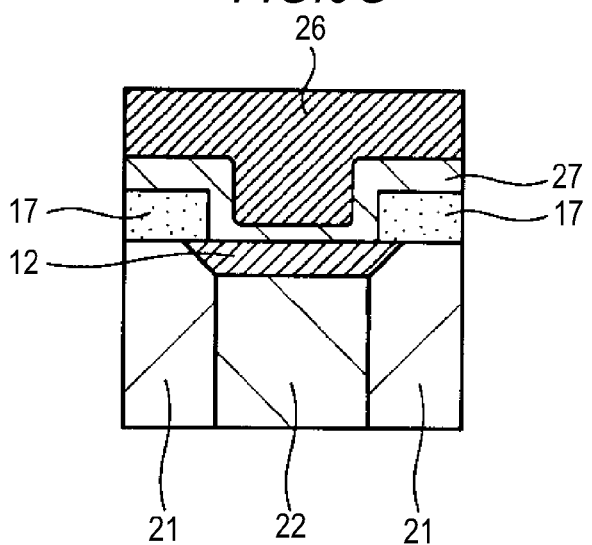

Next, as shown in FIG. 9G, a second film 26 that is buried in the hole and serves as an ion source layer 14, that is, a CuTe film or the like, is formed on the third film 27 in a thickness of 5 to 300 nm by the same RF sputtering process.

Figure 9H:
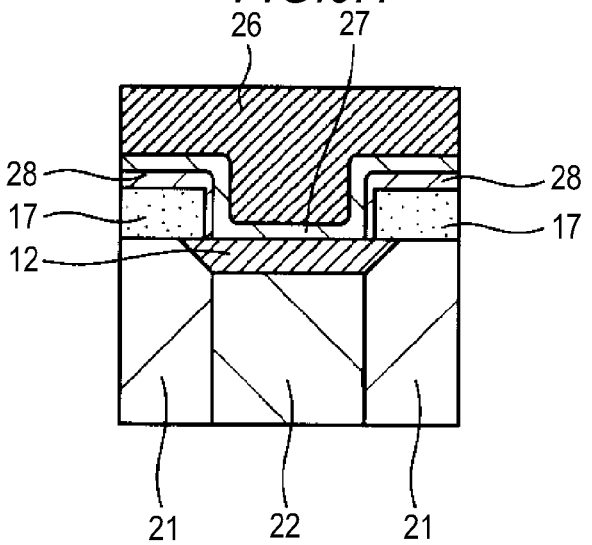

Then, the resultant product is heated by using a heating device such as a hot plate or a furnace under an inert atmosphere at a temperature of 250 to 400° C. for 30 minutes. At this time, the Mn or Al, which is contained in the third film 27 serving as the memory layer 13, diffuses in the third film 27 and reacts with oxygen at an interface with an interlayer insulation layer 17, such that as shown in FIG. 9H, an oxide film 28 having a thickness of 1 to 10 nm is formed.

Figure 10I:
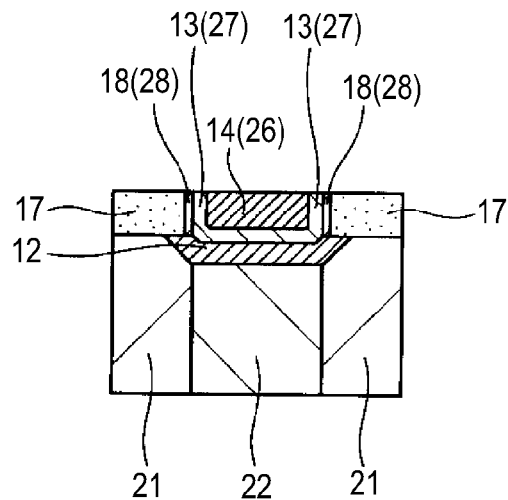
FIGS. 10I and 10J are manufacturing process views illustrating a method of manufacturing the memory device of FIG. 8.

Next, the surface is planarized by a CMP method, and thereby a portion of each of the oxide film 28, the third film 27, and the second film 26, which is located on the interlayer insulation layer 17, is removed with a portion in the hole being made to remain. Therefore, as shown in FIG. 10I, the diffusion preventing barrier film 18 made of the oxide film 28, the memory layer 13 made of the third film 27, and the ion source layer 14 made of the second film 26 are formed in the hole.

Figure 10J:
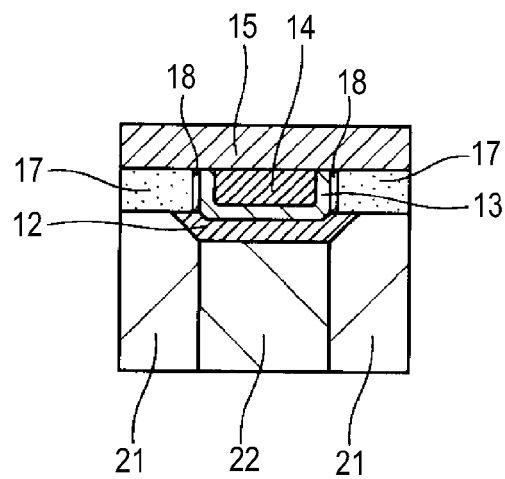

Then, as shown FIG. 10J, the upper electrode 15 is formed on the surfaces of the ion source layer 14, the memory layer 13, the diffusion preventing barrier film 18, and the interlayer insulation film 17 by an RF sputtering process. Therefore, the upper electrode 15 is formed to connect to the surface of the ion source layer 14.

In addition, the layer 16 (insulation layer or the like) covering the upper electrode 15 is formed, such that it is possible to manufacture the memory device shown in FIG. 8.

According to the configuration of the memory device of the above-described embodiment, the diffusion preventing barrier film 18 is formed between a side wall of the memory layer 13 and the interlayer insulation layer 17 isolating each memory cell. Therefore, it is possible to suppress or prevent the diffusion of an element such as Cu contained in the memory layer 13 or the ion source layer 14, which has a high diffusion coefficient.

Therefore, according to the memory device of this embodiment, it is possible to suppress the variation in characteristics of the memory device such as a write-in voltage, a read-out voltage, and the resistance to repetition for each memory cell.

In addition, since it is possible to suppress the deterioration of the characteristics caused by the diffusion of the element into the outside of the memory cell, the characteristic of the resistance to repetition can be improved.

In addition, since it is possible to decrease the margin of a write-in voltage and a read-out voltage for reliably performing the write-in operation and read-out operation by suppressing the variation of the characteristics for each memory cell, it is possible to allow a write-in voltage and a read-out voltage to be lowered.

In addition, the variation of characteristics for each memory cell is suppressed, such that it is possible to reliably perform the write-in and the read-out operation and thereby it is possible to stably operate the memory device.

Therefore, even when the device is made to be miniaturized, it is possible to realize a memory device that can stably operate.

4. A Third Embodiment

Figure 11:
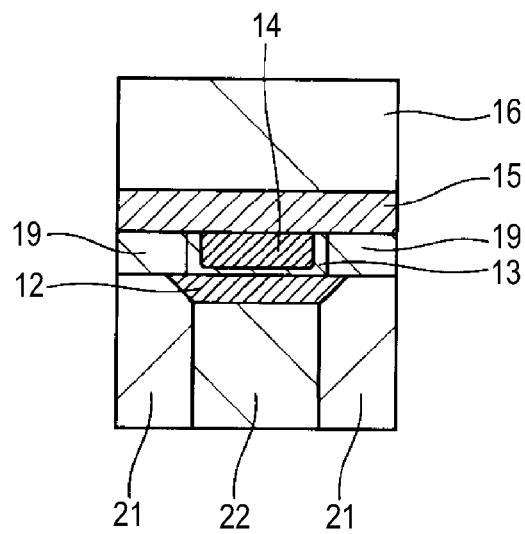
FIG. 11 is a schematic configuration view (cross-sectional view) of a memory device according to a third embodiment of the invention.

FIG. 11 shows a schematic configuration view (cross-sectional view) of a memory device according to a third embodiment of the invention.

This embodiment is a specific embodiment of the second type of memory device shown in FIG. 2.

In addition, FIG. 11 also shows a cross-sectional view of one memory cell, but the memory device is actually configured by a number of memory cells.

In the memory device of the third embodiment, as shown in FIG. 11, a lower electrode 12, a memory layer 13, and an ion source layer 14 of a memory cell are formed in this order on a polysilicon plug layer 22 that is formed to be buried in an insulation layer 21 such as a silicon oxide layer. An upper electrode 15 is formed on these components in common with an adjacent memory cell. In FIG. 11, a reference number 16 indicates a layer (insulation layer or the like) that covers the upper electrode 15.

The upper surface of the lower electrode 12 is formed to have a pattern wider than the memory layer 13. As described above, the upper surface is formed to have a pattern wider than the memory layer 13, such that even when alignment deviation between the lower electrode 12 and the memory layer 13 may occur, the entirety of the lower surface of the memory layer 13 can be allowed to come into contact with the lower electrode 12.

The memory layer 13 is formed to have a U-shaped cross section.

The ion source layer 14 is formed on the memory layer 13 and inside the memory layer 13 having the U-shaped cross section.

As a material of each of the lower electrode 12, the upper electrode 15, the memory layer 13, and the ion source layer 14, the materials described as an example in the first embodiment may be used.

In this embodiment, especially, a diffusion preventing barrier layer 19 is formed as an insulation layer isolating each memory cell.

As a material of the diffusion preventing barrier layer 19, a nitrogen-containing resin material, amorphous SiN, amorphous SiCN, or the like may be used.

Therefore, it is possible to suppress or prevent the diffusion of an element such as Cu contained in the memory layer 13 or the ion source layer 14, which has a high diffusion coefficient.

The memory device of this embodiment can be manufactured, for example, as described below.

Figure 12A:
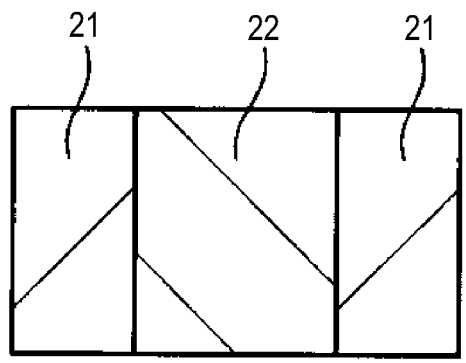
FIGS. 12A to 12C are manufacturing process views illustrating a method of manufacturing the memory device of FIG. 11.

First, as shown in FIG. 12A, in the insulation layer 21 such as a silicon oxide layer, the polysilicon plug layer 22 connected to an underlayer transistor (not shown) is formed to be buried therein.

Figure 12B:
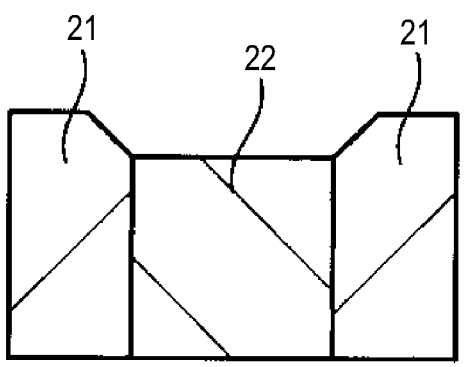

Then, as shown in FIG. 12B, the upper portion of the polysilicon plug layer 22 is made to be recessed further than the neighboring insulation layer 21 through dry etching. CxFy (x=1 to 6, y=1 to 8), $O_2$, or a rare gas is used for the dry etching, and a general magnetron type etching device is used as an etching device.

Next, a metal film made of W, WN, Ti, TiN, or the like is buried in an opening of the polysilicon plug layer 22 by an RF sputtering process.

Figure 12C:
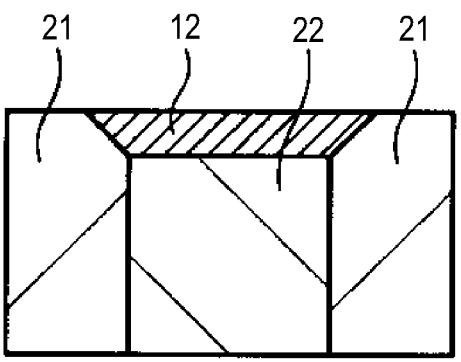

In addition, a metal film remaining on the insulation layer 21 is removed by using a CMP (Chemical Mechanical Polishing) method or a dry etching, and then as shown in FIG. 12C, the lower electrode 12 made of a metal film is formed on the polysilicon plug layer 22.

Figure 13D:
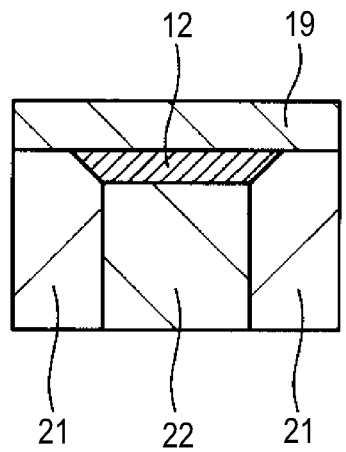
FIGS. 13D to 13F are manufacturing process views illustrating a method of manufacturing the memory device of FIG. 11.

Next, as shown in FIG. 13D, a diffusion preventing barrier layer 19 having a thickness of 20 to 300 nm is formed by entirely covering the insulation layer 21 and the polysilicon plug layer 22. Therefore, the diffusion preventing barrier layer 19 is formed on the lower electrode 12. As a material of the diffusion preventing barrier layer 19, a resin material such as BCB (benzocyclobutene) or amorphous SiC or SiCN is used. In addition, as a method of forming the diffusion preventing barrier layer 19, either a plasma CVD (Chemical Vapor Deposition) method or a spin coat method may be used.

Subsequently, a hole reaching the lower electrode 12 is formed to be opened in the diffusion preventing barrier layer 19 by a lithography and dry etching.

These processes may use a method used in a method of manufacturing a semiconductor in the related art.

As the lithography, a KrF exposure device, an ArF exposure device, or a liquid immersion ArF exposure device is used for patterning a resist mask. In addition, for the dry etching, CxFy (x=1 to 6, y=1 to 8), $O_2$, or a rare gas is used as an etching gas, and a general magnetron type etching device is used as an etching device.

Figure 13E:
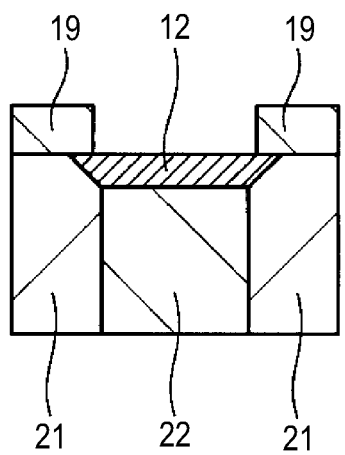

After the diffusion preventing barrier layer 19 is etched, for example, the resist mask and a remaining attached material generated at the time of the etching process are completely removed by an ashing process using oxygen plasma as a base or an organic amine-series chemical process. This state is shown in FIG. 13E.

Figure 13F:
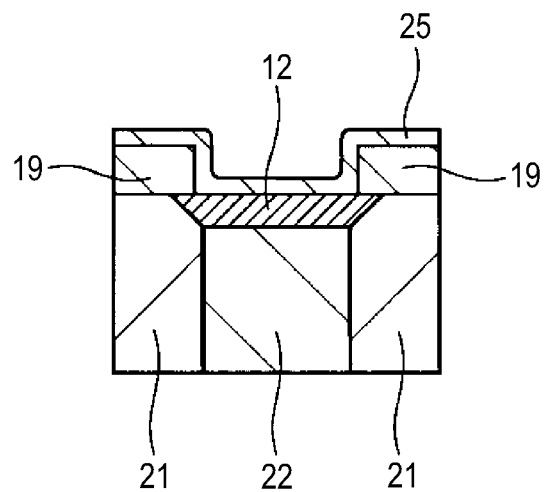

Next, as shown in FIG. 13F, a first film 25, that is, a tantalum oxide film, a niobium oxide film or the like, which comes into contact with the lower electrode 12, is thinner than a depth of the hole and serves as the memory layer 13, is formed in a thickness of 1 to 50 nm, by an RF sputtering process. Therefore, the first film 25 is formed on the lower portion and the side wall of the hole.

Figure 14G:
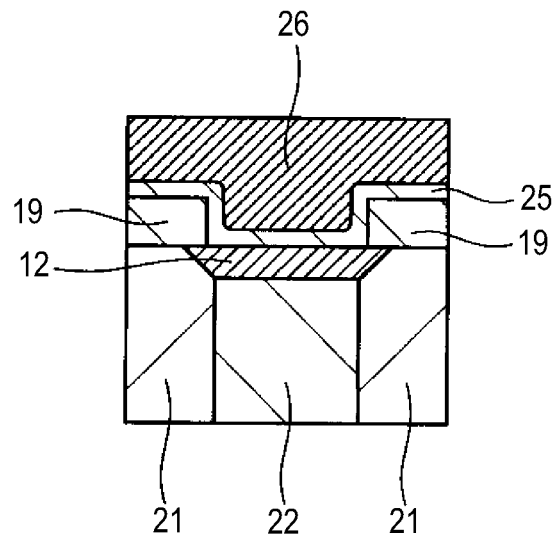
FIGS. 14G to 14I are manufacturing process views illustrating a method of manufacturing the memory device of FIG. 11.

Subsequently, as shown in FIG. 14G, a second film 26, that is, a CuTe film or the like, which is buried in the hole and serves as the ion source layer 14, is formed on the first film 25 in a thickness of 5 to 300 nm by the RF sputtering process.

Figure 14H:
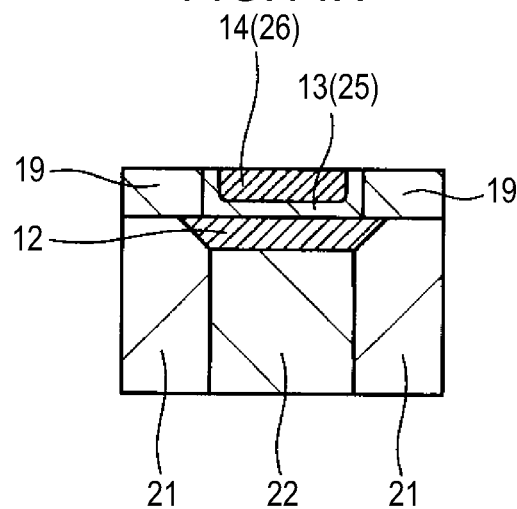

Next, the surface of the second film 26 is planarized by a CMP method, and thereby a portion of each of the first film 25 and the second film 26, which is located on the diffusion preventing barrier layer 19, is removed with a portion in the hole being made to remain. Therefore, as shown in FIG. 14H, the memory layer 13 made of the first film 25 and the ion source layer 14 made of the second film 26 are formed in the hole.

Figure 14I:
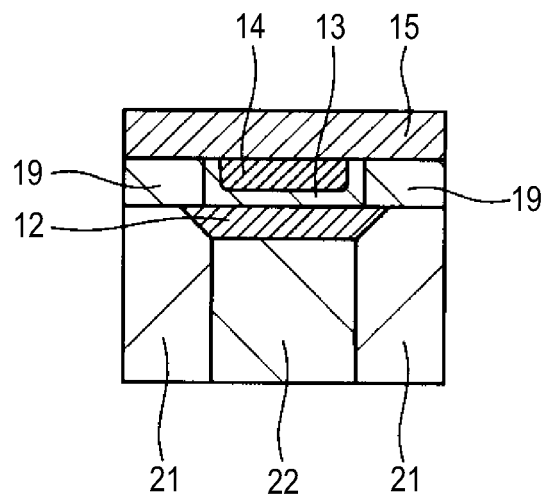

Then, as shown in FIG. 14I, the upper electrode 15 is formed on the surfaces of the ion source layer 14, the memory layer 13 and the diffusion preventing barrier layer 19 by an RF sputtering process. Therefore, the upper electrode 15 is formed to connect to the surface of the ion source layer 14.

In addition, the layer 16 (insulation layer or the like) covering the upper electrode 15 is formed, such that it is possible to manufacture the memory device shown in FIG. 11.

According to the configuration of the memory device of the above-described embodiment, the diffusion preventing barrier layer 19 is formed as an insulation layer isolating each memory cell. Therefore, it is possible to suppress or prevent the diffusion of an element such as Cu contained in the memory layer 13 or the ion source layer 14, which has a high diffusion coefficient.

Therefore, according to the configuration of the memory device of this embodiment, it is possible to suppress the variation in characteristics of the memory device such as a write-in voltage, a read-out voltage and the resistance to repetition for each memory cell.

In addition, since it is possible to suppress the deterioration of the characteristics caused by the diffusion of the element into the outside of the memory cell, the characteristic of the resistance to repetition can be improved.

In addition, since it is possible to decrease the margin of a write-in voltage and a read-out voltage for reliably performing the write-in operation and read-out operation by suppressing the variation of the characteristics for each memory cell, it is possible to allow a write-in voltage and a read-out voltage to be lowered.

In addition, the variation of characteristics for each memory cell is suppressed, such that it is possible to reliably perform the write-in and the read-out operation and thereby it is possible to stably operate the memory device.

Therefore, even when the device is made to be miniaturized, it is possible to realize a memory device that can stably operate.

5. A Fourth Embodiment

Figure 15:
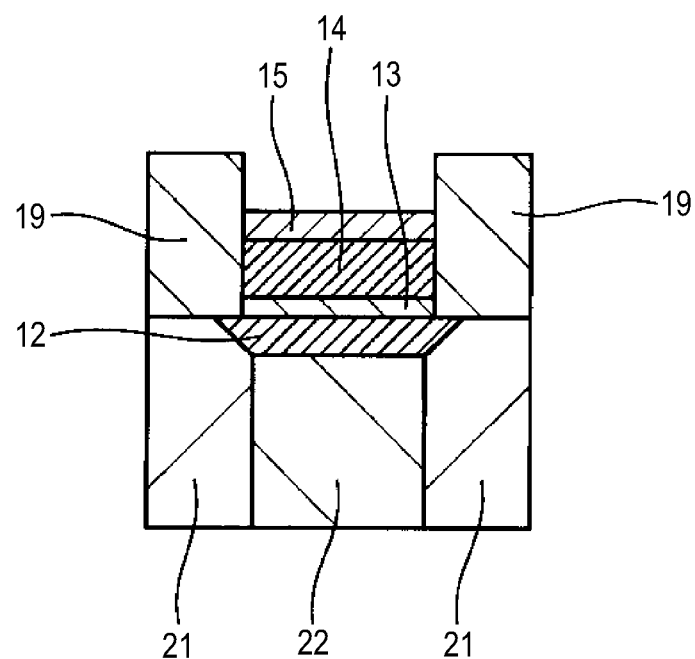
FIG. 15 is a schematic configuration view (cross-sectional view) of a memory device according to a fourth embodiment of the invention.

FIG. 15 shows a schematic configuration view (cross-sectional view) of a memory device according to a fourth embodiment of the invention.

This embodiment is a specific embodiment of the second type of memory device shown in FIG. 2.

In addition, FIG. 15 also shows a cross-sectional view of one memory cell, but the memory device is actually configured by a number of memory cells.

In the memory device of the fourth embodiment, as shown in FIG. 15, a lower electrode 12, a memory layer 13, an ion source layer 14, and an upper electrode 15 of a memory cell are formed in this order on a polysilicon plug layer 22 that is formed to be buried in an insulation layer 21 such as a silicon oxide layer.

The upper surface of the lower electrode 12 is formed to have a pattern wider than the memory layer 13. As described above, the upper surface is formed to have a pattern wider than the memory layer 13, such that even when alignment deviation between the lower electrode 12 and the memory layer 13 may occur, the entirety of the lower surface of the memory layer 13 can be allowed to come into contact with the lower electrode 12.

In addition, the memory layer 13, the ion source layer 14, and the upper electrode 15 are formed in the same plane pattern.

As a material of each of the lower electrode 12, the upper electrode 15, the memory layer 13, and the ion source layer 14, the materials described as an example in the first embodiment may be used.

In this embodiment, especially, a diffusion preventing barrier layer 19 is formed as an insulation layer isolating each memory cell.

As a material of the diffusion preventing barrier layer 19, a nitrogen-containing resin material, amorphous SiN, amorphous SiCN, or the like may be used.

Therefore, it is possible to suppress or prevent the diffusion of an element such as Cu contained in the memory layer 13 or the ion source layer 14, which has a high diffusion coefficient.

The memory device of this embodiment can be manufactured, for example, as described below.

Each of the processes to the process of forming the lower electrode 12 is substantially the same as the manufacturing method of the third embodiment shown in FIGS. 12A to 12C. Therefore, FIGS. 12A to 12C are adopted and description thereof will be omitted.

Figure 16D:
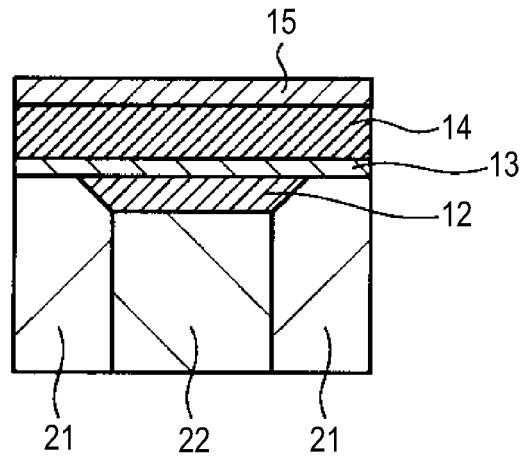
FIGS. 16D to 16F are manufacturing process views illustrating a method of manufacturing the memory device of FIG. 15.
Figure 16E:
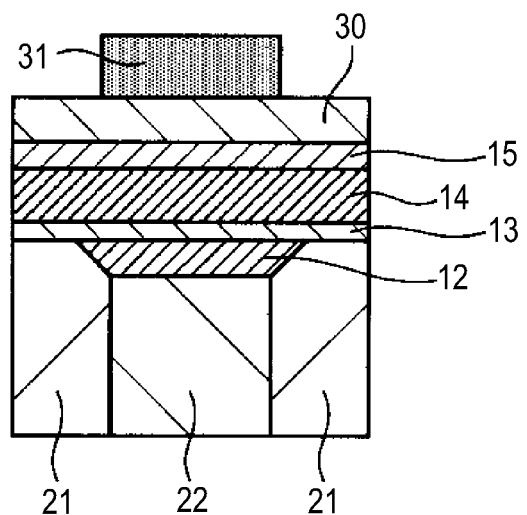

In this embodiment, from the same state as that shown in FIG. 12C, as shown in FIG. 16D, the memory layer 13, the ion source layer 14, and the upper electrode 15 are sequentially formed to have a thickness of 1 to 50 nm, 5 to 100 nm and 20 to 100 nm, respectively, by an RF sputtering process.

Next, a $SiO_2$ film 30 serving as a hard mask for processing a metal layer of the upper electrode 15 is formed in a thickness of 10 to 200 nm by using a plasma CVD method.

Then, resist patterning is performed by using an ArF exposure device or an KrF exposure device to form a resist mask 31 on the $SiO_2$ film 30, as shown in FIG. 12E.

Figure 16F:
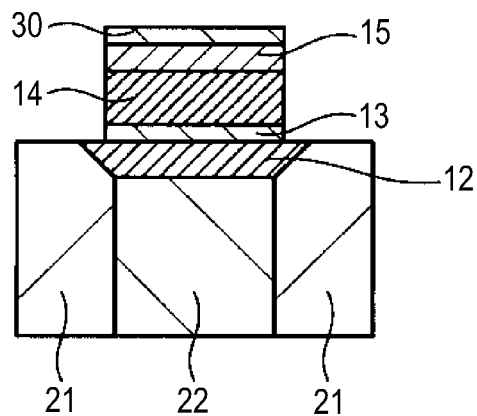

Next, as shown in FIG. 16F, each layer from the upper electrode 15 to the memory layer 13 is patterned in a pattern for each memory cell by using an ion milling or dry etching. At this time, Ar ion is used in the case of the ion milling, and a chlorine-based gas, or a chlorine-based gas and a rare gas are used in the case of the dry etching.

Figure 17G:
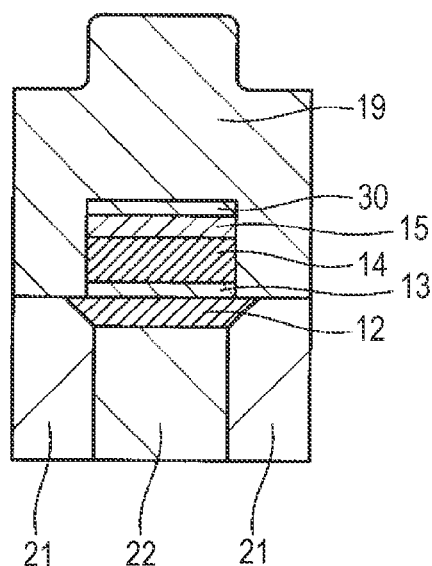
FIGS. 17G to 17I are manufacturing process views illustrating a method of manufacturing the memory device of FIG. 15.

Next, as shown in FIG. 17G, the diffusion preventing barrier layer 19, which is made of an insulation layer and prevents the diffusion of the element, is formed in a thickness of 20 to 300 nm by entirely covering the memory layer 13, the ion source layer 14, and the upper electrode 15.

As a material of the diffusion preventing barrier layer 19, a nitrogen-containing resin material such as BCB (benzocyclobutene) or amorphous SiC or SiCN is used. In addition, as a method of forming the diffusion preventing barrier layer 19, either a plasma CVD (Chemical Vapor Deposition) method or a spin coat method may be used.

Figure 17H:
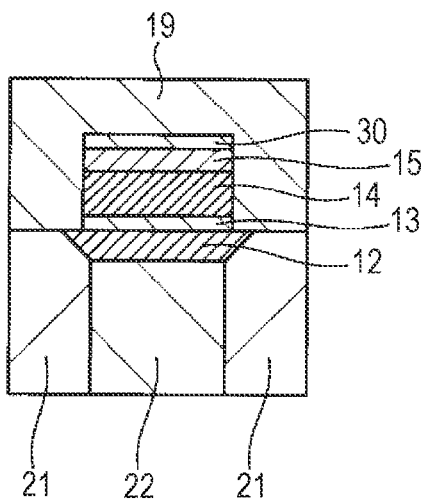

Next, as shown in FIG. 17H, a surface of the diffusion preventing barrier layer 19 is planarized by using a CMP method.

Figure 17I:
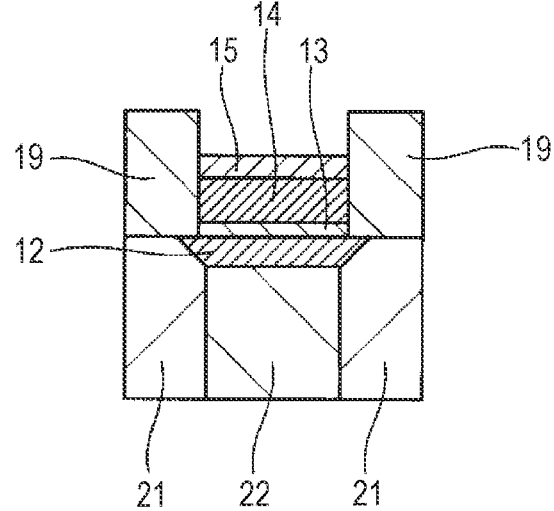
Figure 18:
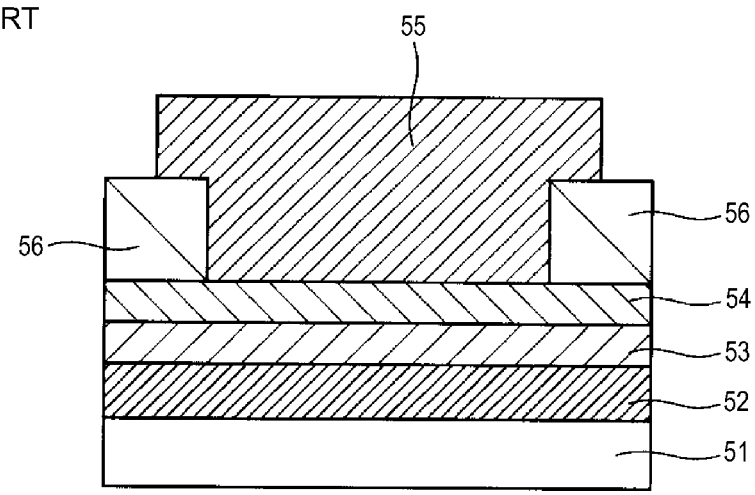
FIG. 18 is a cross-sectional view of a memory device suggested in the related art.

In addition, as shown in FIG. 17I, an opening reaching the upper electrode 15 is formed in the diffusion preventing barrier layer 19 by using lithography and a dry etching method, and an upper structure (not shown) and a contact hole are formed on the upper electrode 15. Therefore, it is possible to manufacture the memory device shown in FIG. 15.

According to the configuration of the memory device of the above-described embodiment, the diffusion preventing barrier layer 19 is formed as an insulation layer isolating each memory cell. Therefore, it is possible to suppress or prevent the diffusion of an element such as Cu contained in the memory layer 13 or the ion source layer 14, which has a high diffusion coefficient.

Therefore, according to the configuration of the memory device of this embodiment, it is possible to suppress the variation in characteristics of the memory device such as a write-in voltage, a read-out voltage, and the resistance to repetition for each memory cell.

In addition, since it is possible to suppress the deterioration of the characteristics caused by the diffusion of the element into the outside of the memory cell, the characteristic of the resistance to repetition can be improved.

In addition, since it is possible to decrease the margin of a write-in voltage and a read-out voltage for reliably performing the write-in operation and read-out operation by suppressing the variation of the characteristics for each memory cell, it is possible to allow a write-in voltage and a read-out voltage to be lowered.

In addition, the variation of characteristics for each memory cell is suppressed, such that it is possible to reliably perform the write-in and the read-out operation and thereby it is possible to stably operate the memory device.

Therefore, even when the device is made to be miniaturized, it is possible to realize a memory device that can stably operate.

In the memory device according to the embodiment of the invention, it is preferable that each memory cell electrically connects to a transistor selecting each memory cell on a one-to-one basis.

In addition, in the embodiment of the invention, a structure configured by laminating each layer of the lower electrode, the memory layer, the ion source layer, and the upper electrode is not limited to the structures shown in FIGS. 1 and 2 and the above-described embodiments, and other structures may be adopted.

For example, in the above-described embodiments, the ion source layer 14 is laminated on the memory layer 13. The invention includes a configuration where the memory layer is laminated on the ion source layer, and the ion source layer and the memory layer are isolated for each memory cell.

The invention is not limited to the above-described embodiments and various configurations may be made without departing from the scope of the invention.

The present application contains subject matter related to that disclosed in Japanese Priority Patent Application JP 2010-079695 filed in the Japan Patent Office on Mar. 30, 2010, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A method of manufacturing a memory device comprising the steps of:
   forming an insulation layer on a lower electrode layer and opening a hole in the insulation layer reaching the lower electrode layer;
   forming, on top surfaces of the insulation layer and surfaces of the hole, a nitride film or an oxide film of a metal element selected from Ti, Ta, Ru, Mn, Al, Co, or W, or an alloy of any of these metal elements, and which is thinner than a depth of the hole;
   removing the nitride film or oxide film in a lower portion of the hole and exposing the lower electrode layer via the hole while leaving some of the nitride film or oxide film at least on sidewalls of the hole;
   forming a first film that comes into contact with the lower electrode layer and with the nitride film or the oxide film and that is thinner than the depth of the hole;
   forming, on the first film, a second film part of which is buried in the hole and which contains at least an element selected from Cu, Ag, Zn, Al, or-and-Zr, and at least one element selected from Te, S, or-and-Se;
   planarizing a surface to remove portions of the nitride film or oxide film, the first film, and the second film, which are located on the insulation layer, with remainder portions of the nitride film or oxide film, the first film, and the second film in the hole being made to remain and forming a diffusion preventing barrier film that is made from the remainder portion of the nitride film or oxide film, a memory layer made from the remainder portion of the first film, and an ion source layer made from the remainder of the second film, and forming an upper electrode layer on the ion source layer.

* * * * *